US012622186B2

(12) United States Patent
Ikeno et al.

(10) Patent No.: US 12,622,186 B2
(45) Date of Patent: May 5, 2026

(54) METHOD OF MANUFACTURING DIAMOND SUBSTRATE

(71) Applicants: Shin-Etsu Polymer Co., Ltd., Tokyo (JP); Shin-Etsu Chemical Co., Ltd., Tokyo (JP); National University Corporation Saitama University, Saitama (JP)

(72) Inventors: Junichi Ikeno, Saitama (JP); Yohei Yamada, Saitama (JP); Hideki Suzuki, Saitama (JP); Rika Matsuo, Saitama (JP); Hitoshi Noguchi, Tokyo (JP)

(73) Assignees: SHIN-ETSU POLYMER CO., LTD., Tokyo (JP); SHIN-ETSU CHEMICAL CO., LTD., Tokyo (JP); NATIONAL UNIVERSITY CORPORATION SAITAMA UNIVERSITY, Saitama (JP)

( * ) Notice: Subject to any disclaimer, the term of this patent is extended or adjusted under 35 U.S.C. 154(b) by 966 days.

(21) Appl. No.: 17/856,173

(22) Filed: Jul. 1, 2022

(65) Prior Publication Data

US 2023/0010575 A1 Jan. 12, 2023

(30) Foreign Application Priority Data

Jul. 2, 2021 (JP) ................................ 2021-110836

(51) Int. Cl.
*H01L 21/02* (2006.01)
*C30B 29/04* (2006.01)
(52) U.S. Cl.
CPC .. *H01L 21/02376* (2013.01); *H01L 21/02527* (2013.01); *H01L 21/0262* (2013.01); *C30B 29/04* (2013.01)

(58) Field of Classification Search
CPC ......... H01L 21/02376; H01L 21/02527; H01L 21/0262; C30B 29/04; C30B 33/06;
(Continued)

(56) References Cited

U.S. PATENT DOCUMENTS 12,416,098 B2 * 9/2025 Ikeno ...................... C30B 33/04
2007/0252154 A1 11/2007 Uchiyama et al.
(Continued)

FOREIGN PATENT DOCUMENTS

CN 110691671 A 1/2020
CN 111745305 A 10/2020
(Continued)

OTHER PUBLICATIONS

Extended European Search Report dated Oct. 27, 2022 corresponding to application No. 22181465.0-1103.

*Primary Examiner* — Dale E Page
*Assistant Examiner* — Quovaunda Jefferson
(74) *Attorney, Agent, or Firm* — Nath, Goldberg & Meyer; Jerald L. Meyer

(57) ABSTRACT

A method of manufacturing a diamond substrate includes: a step of placing a laser condensing unit 190 configured to condense laser light B so as to face an upper surface 10a of a block 10 of single crystal diamond; and a step of forming a modified layer 20, which includes a processing mark 21b of graphite and a crack 22b extending along a surface (111) around the processing mark 21b, along the surface (111) of the single crystal diamond at a predetermined depth from an upper surface of the block by radiating the laser light B on the upper surface 10a of the block 10 from the laser condensing unit 190 under predetermined conditions and condensing the laser light B inside the block 10, and moving the laser condensing unit 190 and the block 10 in a relative manner two-dimensionally.

20 Claims, 10 Drawing Sheets

(58) Field of Classification Search
       CPC ................ C30B 33/04; B23K 2103/50; B23K
                26/0006; B23K 26/0622; B23K 26/0853;
                        B23K 26/53; B23K 26/70
       See application file for complete search history.

(56)                 References Cited

U.S. PATENT DOCUMENTS

2019/0105739 A1 *  4/2019  Ikeno ..................... B23K 26/53
2020/0164469 A1 *  5/2020  Bassett ................ B23K 26/402

FOREIGN PATENT DOCUMENTS

| JP | 2009-61462 | A | 3/2009 | |
| JP | 2021080153 | A | 5/2021 | |
| TW | 201839801 | A | 11/2018 | |
| TW | 201945603 | A | 12/2019 | |
| TW | 202013473 | A | 4/2020 | |
| WO | WO-2012006736 | A2 * | 1/2012 | ......... H01L 21/2633 |
| WO | 2015046294 | A1 | 4/2015 | |
| WO | 2015107907 | A1 | 7/2015 | |

* cited by examiner

FIG. 5A 10a          10          B

[1$\bar{1}$0] $\Longleftrightarrow$ [$\bar{1}$10]

22biL          20

22biL

10b

400 $\mu$ m

METHOD OF MANUFACTURING DIAMOND SUBSTRATE

CROSS REFERENCE TO RELATED APPLICATION

This application is based upon and claims the benefit of priority under 35 U.S.C. § 119 from Japanese Patent Application No. 2021-110836 filed on Jul. 2, 2021, the entire contents of which are incorporated herein by reference.

TECHNICAL FIELD

The present invention relates to a method of manufacturing a diamond substrate, and more particularly to a method of manufacturing a diamond substrate by processing single crystal diamond using laser light.

BACKGROUND

Conventionally, silicon carbide (SiC) and gallium nitride (GaN) have been provided as semiconductor materials suitable for power devices instead of silicon (Si). However, diamond semiconductors have attracted attention as a next-generation material because they have a higher dielectric breakdown field, a higher power control index, and the highest thermal conductivity as compared with the above semiconductor materials, and research and development have been advancing toward practical application. Further, since a nitrogen-vacancy (NV) center in diamond is capable of highly sensitive magnetic detection at room temperature, this is expected to be applied to magnetic sensors, and research and development in this field have also been conducted (see WO 2015/107907 A1).

Single crystal diamond which is expected to be applied to these semiconductors is synthesized by a high pressure and high temperature (HPHT) method and homoepitaxial growth, and these synthesis methods make it difficult to increase the area of a bulk substrate of single crystal diamond for use in semiconductor processes. Accordingly, a chemical vapor deposition (CVD) method has been applied in which single crystal diamond is heteroepitaxially grown by using a single crystal magnesium oxide (MgO) as a base crystal, because this CVD method is advantageous in increasing the area.

In the heteroepitaxial growth by means of the CVD method, a bulk crystal of single crystal diamond, which is grown in the same orientation as the crystal orientation of the base MgO crystal, is obtained. That is, a bulk crystal of diamond with a crystal orientation [100] is obtained when the crystal orientation of the base MgO crystal is [100], and a bulk crystal of diamond with a crystal orientation [111] is obtained when the crystal orientation of the base MgO crystal is [111]. In the application of single crystal diamond to a magnetic sensor, it is necessary to form a high-density NV center and align the orientation axes of the NV center. Since a technique for orienting a high-density NV center in the [111] direction has been established by the CVD method, there has been an increasing need for a (111) bulk crystal using single crystal diamond having a main surface as a (111) surface (see WO 2015/046294 A1 and JP 2021-080153 A).

SUMMARY

Meanwhile, a bulk crystal of single crystal diamond obtained by heteroepitaxial growth is sliced and processed into a plate-like substrate, but diamond is hard and not easy to be processed. As a method for processing into a substrate, a smart cut technique is used in which a defective layer is introduced by ion implantation and is removed by etching to thereby perform delamination, but there has been a problem that a device in a high vacuum environment is required for ion implantation, and the processing time is long. Although it is possible to perform delamination with a thickness of several μm, there have been no cases of delamination with a thickness of several hundred μm.

Other methods for processing into a substrate include polishing a bulk crystal of single crystal diamond, which is separated from abase crystal, to a desired thickness, or applying chemical mechanical polishing (CMP). Further, single crystal diamond obtained by means of the conventional HPHT method is processed to slice an ingot, or a block made by further cutting an ingot to a fixed length, into a substrate, but there has been a problem that a loss occurs as a cutting margin. Since it is especially difficult to polish a bulk crystal of single crystal diamond with the [111] orientation, the development of a manufacturing method for obtaining a (111) substrate has been required.

As described above, there has been a need for a manufacturing method in which a hulk crystal, an ingot, or a block of (111) single crystal diamond, which is expected to be applied to a high-precision magnetic sensor, is sliced into a substrate with a reduction in processing loss due to a cutting margin by means of a relatively simple method.

The present invention has been made in view of the above circumstances, and an object of the present invention is to provide a method of manufacturing a diamond substrate by which a (111) substrate is manufactured with little processing loss from a bulk crystal of single crystal diamond with an [111] orientation, which is heteroepitaxially grown by a CVD method, and from an ingot or a block of single crystal diamond obtained by an HTHP method.

In order to solve the above problem, a method of manufacturing a diamond substrate according to the present invention includes: a step of placing a laser condensing unit configured to condense laser light so as to face an upper surface of a block of single crystal diamond; and a step of forming a modified layer, which includes a processing mark of graphite and a crack extending along a surface (111) around the processing mark, along the surface (111) of the single crystal diamond, at a predetermined depth from the upper surface of the block by radiating laser light on the upper surface of the block from the laser condensing unit and condensing the laser light inside the block, and moving the laser condensing unit and the block in a relative manner two-dimensionally.

The block may have a plate-like shape having an upper surface as the (111) surface of the single crystal diamond. The step of forming the modified layer may include: a step of moving the laser condensing unit and the block in a relative manner in a predetermined scanning direction, and a step of moving the laser condensing unit and the block in a relative manner in a direction orthogonal to the scanning direction at a predetermined interval.

The laser light may be pulsed laser light, and the graphite of the processing mark may be formed by laser light reflected by a crack extending from another adjacent processing mark in at least one of the scanning direction and the direction orthogonal to the scanning direction. The step of forming the modified layer may include forming the modified layer at a predetermined depth over the entire surface of the upper surface.

The method of manufacturing a diamond substrate may further include a step of causing the block to spontaneously delaminate into a portion up to a depth from the upper surface to the modified layer, and a portion deeper than the modified layer. The laser light may have a pulse width in a range of several ns to several hundred ns.

The present invention makes it possible to manufacture a (111) substrate with little processing loss from a bulk crystal of single crystal diamond with an [111] orientation, and an ingot or a block of single crystal diamond obtained by an HTHP method, thereby making it possible to improve the yield in manufacturing the diamond substrate.

BRIEF DESCRIPTION OF THE DRAWINGS

FIGS. 5A to 5D are cross-sectional views illustrating the formation of the modified layer in the block of single crystal diamond.

DETAILED DESCRIPTION

Next, an embodiment of the present invention will be described with reference to the drawings. In the following drawings, the same or similar portions are denoted by the same or similar numerals. However, it should be noted that the drawings are schematic, and the relationship between the thickness and the plane dimensions, the ratios of the thickness of each layer, and the like are different from those in reality. Therefore, the specific thickness and dimensions should be determined in consideration of the following description. Also, it is needless to say that portions having different dimensional relationships and ratios among the drawings are included.

Further, the following embodiments exemplify devices and methods for embodying the technical idea of the present invention, and the embodiments of the present invention do not specify the materials, shapes, structures, arrangements, etc. of the components as follows. Various modifications may be made to the embodiments of the present invention in the claims.

Figure 1:
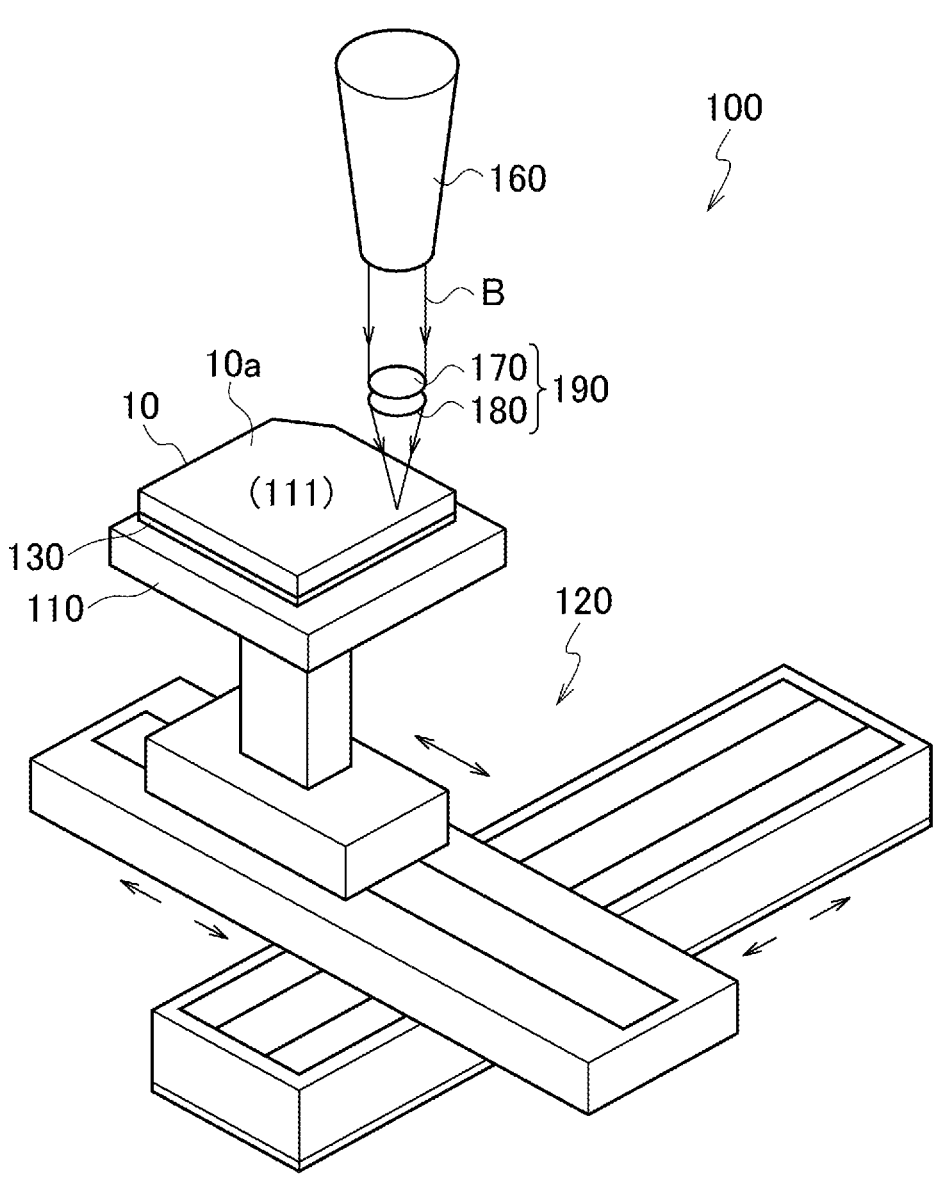
FIG. 1 is a perspective view illustrating a schematic configuration of a processing device.

FIG. 1 is a perspective view illustrating a schematic configuration of a processing device 100. The processing device 100 includes a stage 110 for placing a block 10 of single crystal diamond thereon, a stage support unit 120 for supporting the stage 110 so as to be movable in the XY direction in a horizontal plane, and a fixture 130 for fixing the block 10 of single crystal diamond. An adhesive layer, a mechanical chuck, an electrostatic chuck, a vacuum chuck, or the like may be applied for the fixture 130.

The plate-like block 10 having a rectangular outer periphery, which is formed by cutting an ingot of single crystal diamond to a predetermined length as an object to be processed, is fixed on the stage 110 with a (111) surface as an upper surface 10a. The (111) surface serving as a main surface has an off-angle of 0 degrees. An object to be processed is not limited to this shape, and as long as the upper surface 10a serves as the (111) surface, an ingot of single crystal diamond, a disk-shaped wafer, or a bulk crystal of single crystal diamond may be employed.

The processing device 100 includes a laser light source 160 for generating pulsed laser light, and a laser condensing unit 190 including an objective lens 170 and an aberration adjusting unit 180, and radiates laser light B, which is emitted from the laser light source 160, toward the (111) surface of the upper surface of the block 10 of single crystal diamond via the laser condensing unit 190.

Figure 2A:
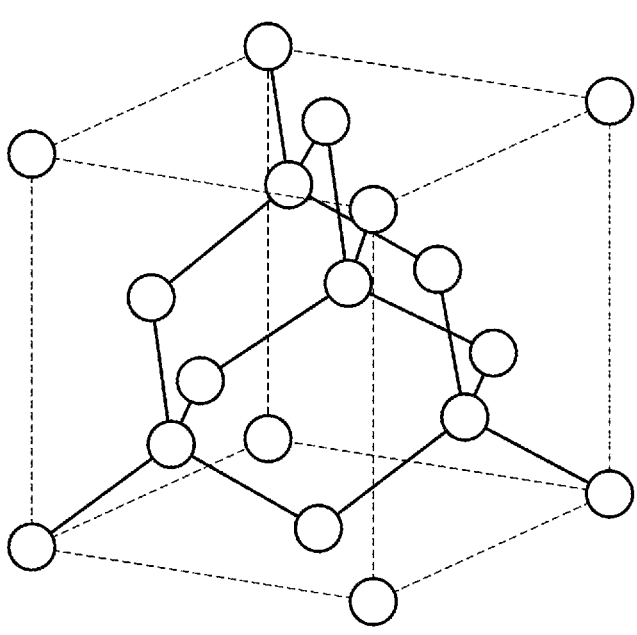
FIGS. 2A and 2B are perspective views illustrating a crystal structure of diamond.
Figure 2B:
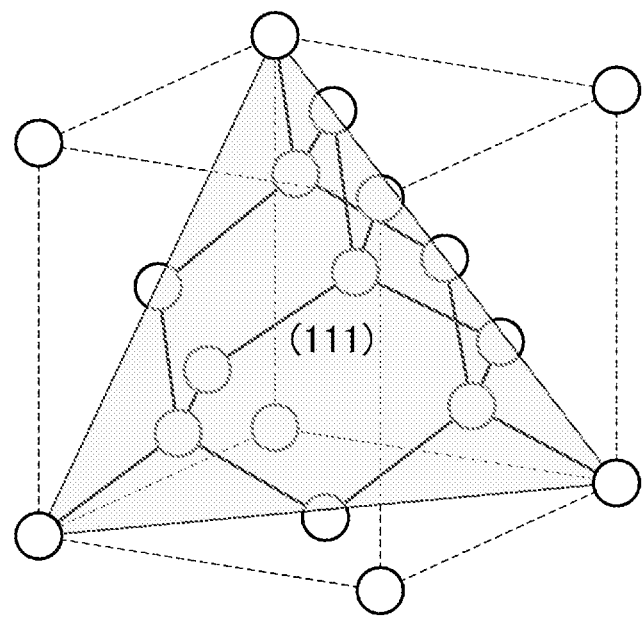

FIGS. 2A and 2B are perspective views illustrating a crystal structure of diamond. As illustrated in FIG. 2A, in a diamond crystal, carbon atoms indicated by white circles are covalently bonded to adjacent carbon elements by the arms of $sp^3$ hybrid orbitals extending in the direction of the four respective vertices of the tetrahedron centered on the carbon atoms. The covalent bonds are illustrated as solid lines. The carbon atoms, which are covalently bonded to each of the four adjacent carbon atoms, form a body-centered cubic lattice called a diamond structure.

FIG. 2B illustrates the (111) surface in the diamond structure. It is conventionally known that single crystal diamond is very hard because carbon atoms form covalent bonds with four respective adjacent carbon atoms in a diamond structure. However, a carbon atom is covalently bonded to an adjacent carbon atom in the <111> direction by only a single arm of the $sp^3$ hybrid orbital. Accordingly, when the covalent bond of the single arm is cut off, it is relatively easy to separate the carbon atom from the adjacent carbon atom in the direction of the (111) surface orthogonal to the <111> direction. As a result, the (111) surface becomes a cleavage surface.

Figure 3:
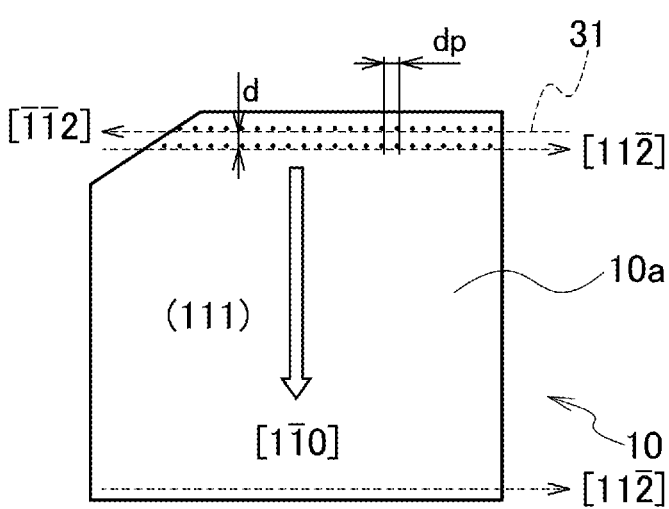
FIG. 3 is a plan view of a block of single crystal diamond illustrating scanning of laser light.

FIG. 3 is a plan view of the block 10 of single crystal diamond illustrating scanning of the laser light B. The block 10 of single crystal diamond placed on the stage 110 of the processing device 100 illustrated in FIG. 1 moves two-dimensionally in the XY direction in a horizontal plane relative to the laser condensing unit 190 such that the laser light B radiated from the laser light condensing unit 190 is radiated toward a predetermined position on the upper surface 10a of the block 10 of single crystal diamond. Here, the block 10 has the (111) surface, which serves as a main surface with an off-angle of 0 degrees, as the upper surface 10a.

A scanning line 31 of the laser light B is first scanned in the $[\overline{1}\overline{1}2]$ direction at a dot pitch dp, and shifted by a line pitch d in the $[1\overline{1}0]0$ direction orthogonal to the $[\overline{1}\overline{1}2]$ direction, and the laser light B is scanned in the $[11\overline{2}]$ direction at a dot pitch dp to form a new scanning line 31. By repeating the formation of the scanning line 31 in this way, a modified layer 20 is continuously formed along the (111) surface inside the block 10 of single crystal diamond.

Inside the block 10 of single crystal diamond, the laser light B is condensed from the upper surface 10a at a predetermined depth, and a processing mark of graphite and a crack extending along the (111) surface around the processing mark are formed. The laser light B of a nanosecond pulse laser, which is emitted from the laser light source 160, is reflected by the crack formed along the (111) surface as the cleavage surface, and the diamond is pyrolyzed, and thus the processing mark of graphite is formed. Here, the nanosecond pulse laser refers to a laser having a pulse width, that is, a pulse duration in the range of several ns to several hundred ns, more specifically, in the range of 1 ns or more to less than 1 $\mu$s.

FIGS. 4A to 4D are plan views illustrating the formation of the modified layer 20 in the block 10 of single crystal diamond. FIGS. 5A to 5B are cross-sectional views illustrating the formation of the modified layer 20 in the block 10 of single crystal diamond. FIG. 5A to 5D respectively correspond to cross sections formed by the cutting lines in FIGS. 4A to 4D.

Figure 4A:
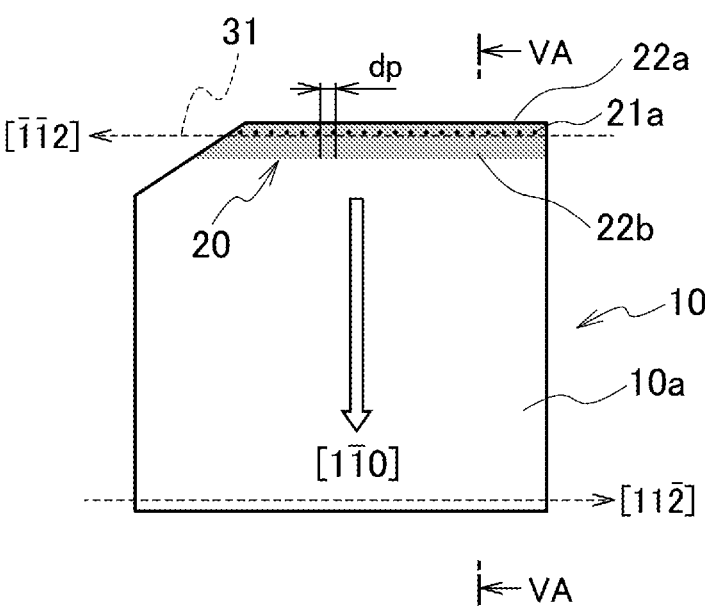
FIGS. 4A to 4D are plan views illustrating the formation of a modified layer in the block of single crystal diamond.
Figures 5A, 5B:
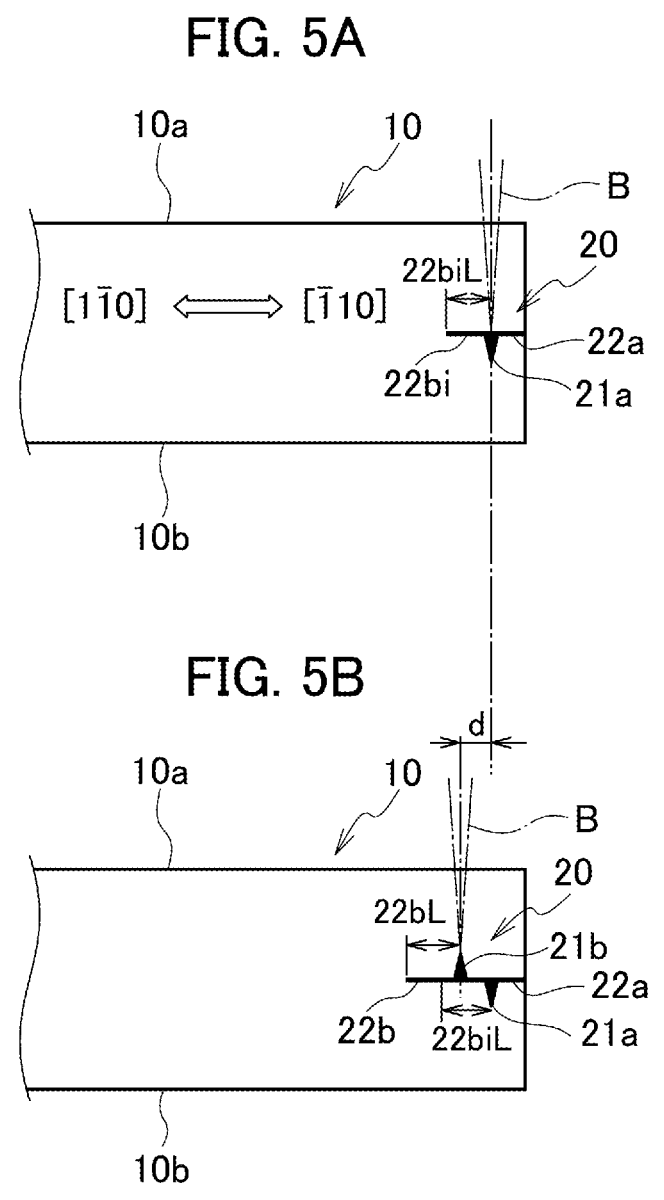
Figure 5C:
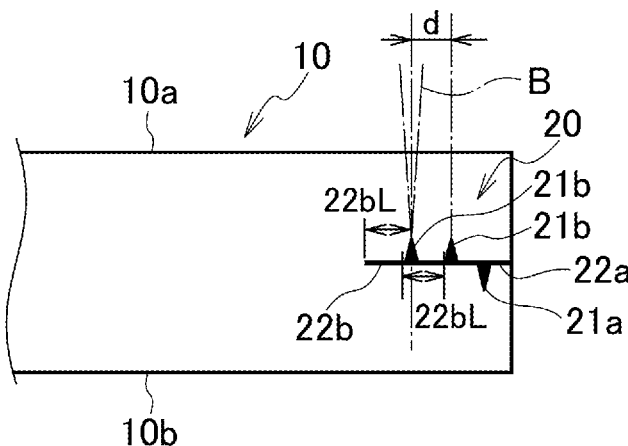

Referring to FIGS. 4A and 5A, a first scan line 31 is directed in the [$\bar{1}\bar{1}2$] direction, and a processing mark 21$a$ is directed toward the lower surface 10$b$ facing the upper surface 10$a$ in the block 10 of single crystal diamond. In addition, a crack 22$a$ extending in the [$\bar{1}10$] direction, and a crack 22$bi$ extending in the [1$\bar{1}0$] direction are formed along the (111) surface due to cleavage from the processing mark 21$a$, and the modified layer 20 including the processing mark 21$a$, the crack 22$a$, and the crack 22$bi$ is formed around the first scan line 31. The processing mark 21$a$ has a conical shape which has the bottom surface near the cracks 22$a$ and 22$bi$ and the vertex in the direction of the lower surface 10$b$. In the processing mark 21$a$, the diamond is pyrolyzed into graphite by the condensed laser light B. Here, the length 22$bi$L of the crack 22$bi$ extending in the [1$\bar{1}0$] direction is adjusted by the energy of the laser light B at the condensing point, the irradiated dot pitch dp, and the expansion of the processing mark 21$a$ controlled by the focal depth.

Figure 4B:
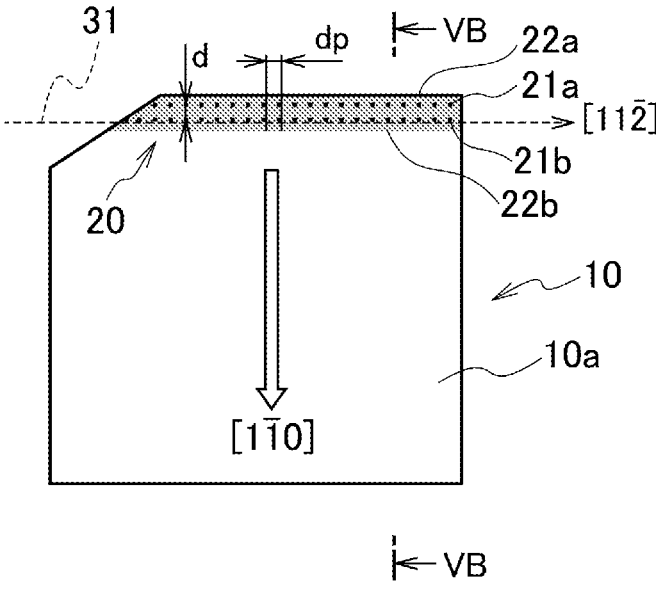

Referring to FIGS. 4B and 5B, a second scan line 31 is performed after the laser condensing unit 190 moves in a relative manner two-dimensionally by the line pitch d from the first scan line 31 in the [1$\bar{1}0$] direction orthogonal to the scanning direction of the first scan line 31. At this time, the line pitch d is se such that the focal point of the laser light B is on the crack 22$bi$. That is, the relationship between the line pitch d and the length 22$bi$L of the crack 22$bi$ is the length 22$bi$L>the line pitch d.

A second scan line 31 is directed in the [11$\bar{2}$] direction, and a processing mark 21$b$ is directed toward the upper surface 10$a$. In addition, a crack 22$b$ extending in the [1$\bar{1}0$] direction along the (111) surface is formed due to cleavage from the processing mark 21$b$, and the modified layer 20 including the processing mark 21$b$, the cracks 22$b$ and 22$bi$ is formed around the second scan line 31. The processing mark 21$b$ has a conical shape which has the bottom surface near the cracks 22$b$ and 22$bi$ and the vertex in the direction of the upper surface 10$a$. In the processing mark 21$b$, the diamond is pyrolyzed into graphite by the condensed laser light B.

Here, cleavage of a length of 22$b$L occurs in the crack 22$b$ along the (111) surface in the [1$\bar{1}0$] direction due to expansion of the processing mark 21$b$, and thus the modified layer 20 expands. At this time, cleavage also develops in the cracks 22$bi$ and 22$a$ due to the expansion of the processing mark 21$b$, and as a result, a continuous cleavage surface is formed in the cracks 22$a$, 22$bi$ and 22$b$.

The scanning direction of the laser light B in the first scanning line 31 is not particularly limited to the [$\bar{1}\bar{1}2$] direction, and the scanning direction of the laser light B in the second scanning line 31 is not particularly limited to the [11$\bar{2}$] direction. The first scanning line 31 and the second scanning line 31 may be scanned in the [11$\bar{2}$] direction and in the [$\bar{1}\bar{1}2$] direction, respectively, or may be scanned in only one direction. In this regard, however, a scanning direction in which a reciprocal operation is performed is preferable in consideration of the efficiency of moving the laser condensing unit 190 and the block 10 of single crystal diamond in a relative manner.

Figure 4C:
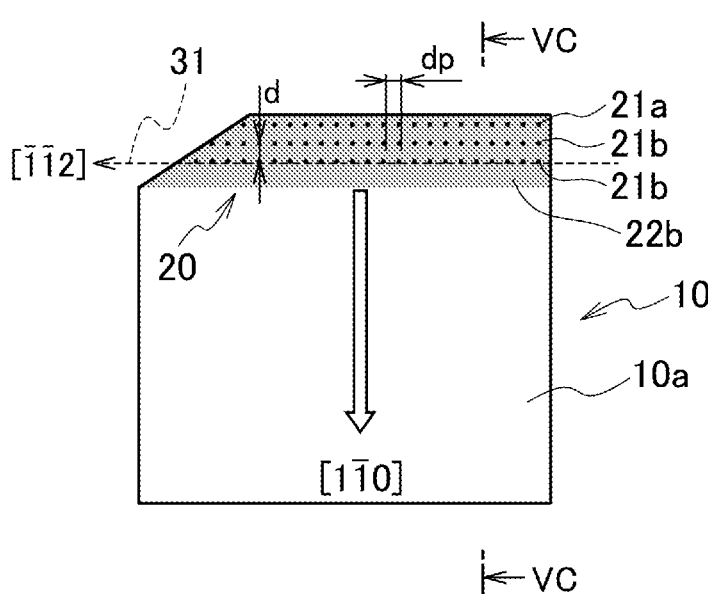

Referring to FIGS. 4C and 5C, a third scan line 31 is performed after the laser condensing unit 190 moves in a relative manner two-dimensionally by the line pitch d from the second scan line 31 in the [1$\bar{1}0$] direction orthogonal to the scanning direction of the second scan line 31. At this time, the line pitch d is set such that the focal point of the laser light B is on the crack 22$b$ where the cleavage has occurred. That is, the relationship between the line pitch d and the length 22$b$L of the crack 22$b$ is the length 22$b$L>the line pitch d.

The third scan line 31 is directed in the [$\bar{1}\bar{1}2$] direction, and the processing mark 21$b$ is directed toward the upper surface 10$a$. In addition, the crack 22$b$ extending in the [1$\bar{1}0$] direction along the (111) surface is formed due to cleavage from the processing mark 21$b$, and the modified layer 20 including the processing mark 21$b$ and the crack 22$b$ is formed around the third scan line 31. The processing mark 21$b$ has a conical shape which has the bottom surface near the crack 22$bi$ and the vertex in the direction of the upper surface 10$a$. In the processing mark 21$b$, the diamond is pyrolyzed into graphite by the condensed laser light B. Here, cleavage of the length 22$b$L occurs in the crack 22$b$ along the (111) surface in the [1$\bar{1}0$] direction due to expansion of the processing mark 21$b$, and thus the modified layer 20 expands.

Figure 4D:
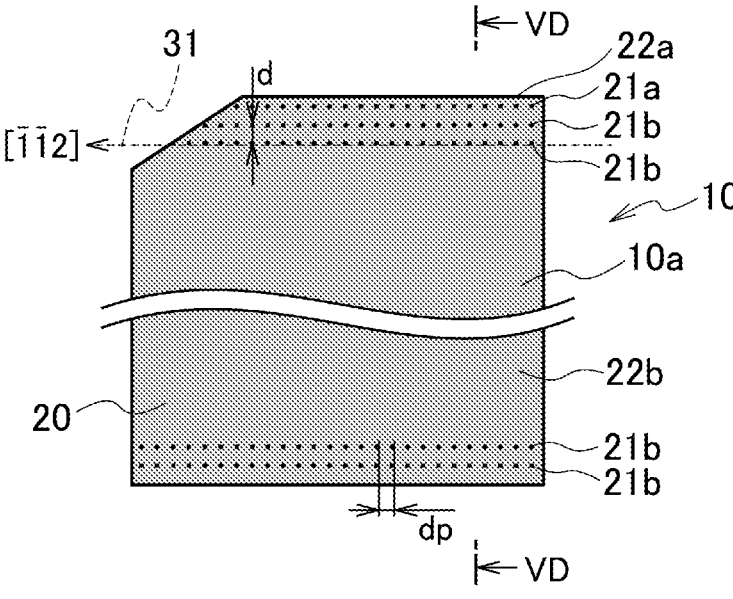
Figure 5D:
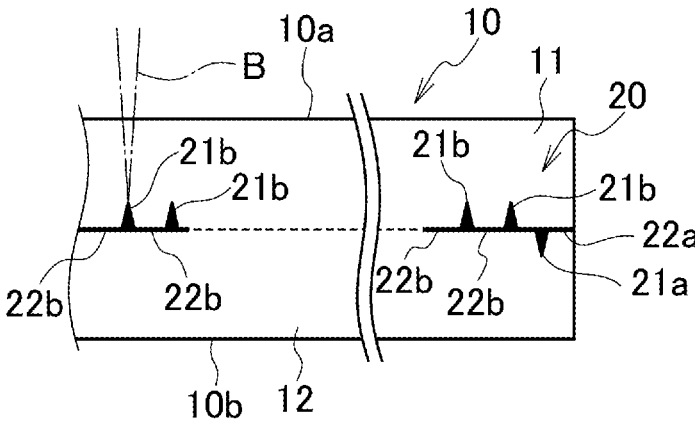

Referring to FIGS. 4D and 5D, the same operation is repeated after the fourth scan line 31 up to the n$^{th}$ scan line 31 toward the end face of the block 10. As a result, the modified layer 20 cleaved in the (111) surface along the crack 22$b$ is formed in the entire surface inside the block 10. A large amount of internal stress is accumulated in the modified layer 20 due to a rapid temperature change when forming the processing marks 21 and the change in the crystal structure from diamond to graphite. In order to release such internal stress, the modified layer 20 spontaneously breaks along the (111) surface as the cleavage surface. Accordingly, at the modified layer 20, the block 10 of single crystal diamond spontaneously delaminates into a first portion 11 from the upper surface 10$a$ to the modified layer 20, and a second portion 12 from the modified layer 20 to the lower surface 10$b$. At least one of the delaminated first portion 11 and the delaminated second portion 12 may be used as a substrate of single crystal diamond. This substrate may include a wafer.

In the block 10 of single crystal diamond delaminated into the first portion 11 and the second portion 12, the modified layer 20 corresponds to a "cutting margin" to be lost by processing. The thickness of the modified layer 20 is equivalent to the height of the processing mark 21$b$ of graphite having a substantially conical shape, and can be set within a range of several $\mu$m or less. Accordingly, it is possible to reduce the amount of single crystal diamond to be lost in manufacturing a diamond substrate by processing the block 10 of single crystal diamond, thereby making it possible to improve the yield in manufacturing the diamond substrate by processing the block 10 of single crystal diamond.

EXAMPLE

In the processing device 100 illustrated in FIG. 1, a nanosecond laser having the specification shown in TABLE 1 was used as the laser light source 160. Further, as shown in TABLE 2, the block 10 of single crystal diamond was moved in a relative manner two-dimensionally with respect to the laser condensing unit 190, and the laser light B was radiated toward the upper surface 10a, which is the (111) surface, to form the modified layer 20 at a predetermined depth from the upper surface 10a. In this Example, Ib-type diamond obtained by means of the HPHT method was employed.

TABLE 1

| SPECIFICATION OF LASER LIGHT SOURCE | |
| --- | --- |
| LASER OSCILLATOR MODEL | Hippo532-11 (MADE BY SPECTRA PHYSICS) |
| WAVELENGTH | 532 nm |
| PULSE WIDTH | 10 ns |
| REPETITION FREQUENCY | 20 kHz |
| OUTPUT | 1 W |

TABLE 2

| LASER LIGHT RADIATION SETTINGS | |
| --- | --- |
| SCANNING VELOCITY | 10 mm/s |
| DOT PITCH dp | 0.5 μm |
| LINE PITCH d | 60 μm |

The conditions of the laser light source 160 and the laser light radiation as above were set in consideration of the length of the crack 22b and the size of the processing mark 21b. Since graphitization proceeds for the length of the crack 22b due to the accumulation of heat by the laser light B condensing unit, it becomes more difficult to control the length of the crack 22b as the graphitized processing mark 21b is increased in size and the spacing of the dot pitch dp and the line pitch d is reduced in size. As a result, it is not possible to control the development of the cleavage of the (111) surface by expansion of the processing mark 21b. Accordingly, the above conditions were set such that the cleavage of the (111) surface could be controlled in order to obtain a stable processing and a delamination state.

As for the size of the processing mark 21b, it is necessary to control the processing mark 21b, that is, the growth of the graphitized portion, in order to reduce the loss after delamination. The conditions were set considering that the depth (growth height) of the processing mark 21a formed in the block 10 of single crystal diamond had to be set to 30 μm or less at the maximum.

As described above, the conditions obtained in consideration of the length of the crack 22b and the size of the processing mark 21b were that under a laser output of 1 W and an oscillation frequency of 20 kHz, a suitable range of the dot pitch dp was 0.5 μm to 1.0 μm, and the range of the line pitch d at this time was 50 μm to 100 μm. Since it is difficult to measure the length of the crack 22b, it is considered to be 100 μm to 150 μm in the range estimated from the above line pitch d. TABLEs 1 and 2 were set based on these considerations.

The entire upper surface 10a of the block 10 of single crystal diamond was scanned under the above conditions to form the modified layer 20 at a predetermined depth from the upper surface 10a. As a result, the block 10 of single crystal diamond spontaneously delaminated at the modified layer 20 to obtain the first portion 11 from the upper surface 10a to the modified layer 20, and the second portion 12 deeper than the modified layer 20.

Figure 6A:
FIGS. 6A and 6B are photographs illustrating a delaminated surface of the block of single crystal diamond which has delaminated at the modified layer.
Figure 6B:
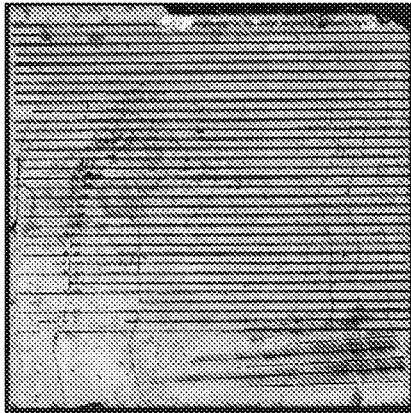

FIGS. 6A and 6B are photographs illustrating a delaminated surface of the block 10 of single crystal diamond which has delaminated at the modified layer 20. FIG. 6A is a photograph of the lower surface of the first portion 11, and FIG. 6B is a photograph of the upper surface of the second portion 12, each of which illustrates the delaminated surface of the modified layer 20.

Figure 7A:
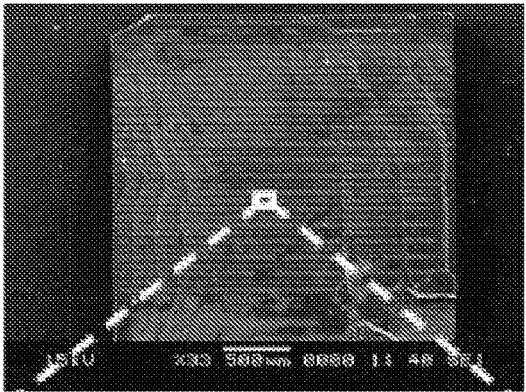
FIGS. 7A and 7B are micrographs of a lower surface of a first portion of the block of single crystal diamond which has delaminated at the modified layer.
Figure 7B:
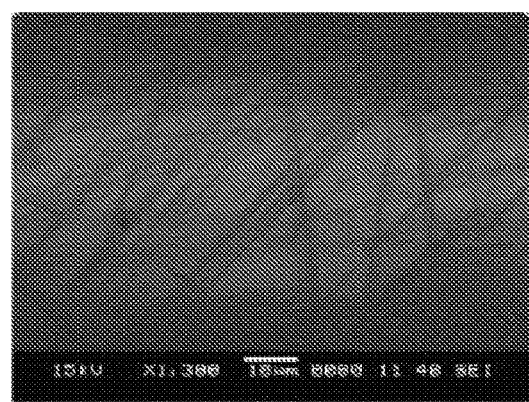

FIGS. 7A and 7B are micrographs, using a scanning electron microscope (SEM), of the lower surface of the first portion 11 of the block 10 of single crystal diamond which has delaminated at the modified layer 20. FIG. 7A illustrates the entire lower surface of the first portion 11, and FIG. 7B illustrates an enlarged partial portion of FIG. 7A. Both figures illustrate the delaminated surface of the modified layer 20 in the lower surface of the first portion 11. In FIG. 7B, it was observed that the processing marks 21 expanded or were recessed in the delaminated surface of the modified layer 20.

Figure 8A:
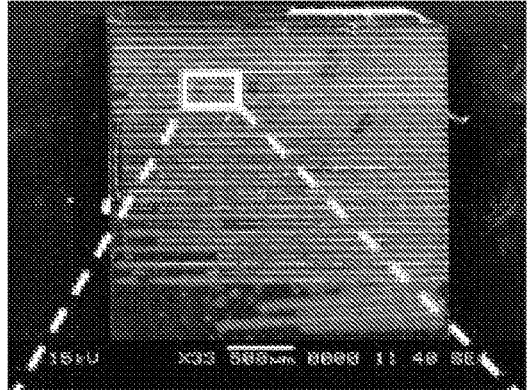
FIGS. 8A and 8B are micrographs of an upper surface of a second portion of the block of single crystal diamond which has delaminated at the modified layer.
Figure 8B:
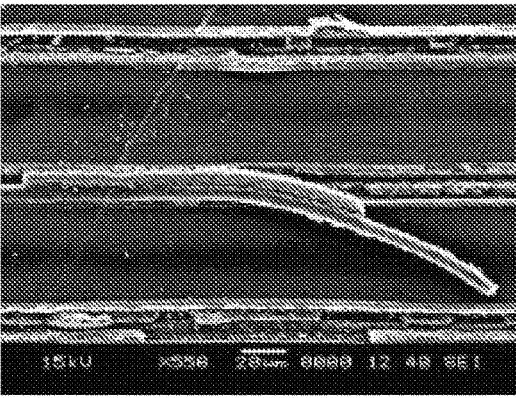

FIGS. 8A and 8B are micrographs, using a scanning electron microscope (SEM), of the upper surface of the second portion 12 of the block 10 of single crystal diamond which has delaminated at the modified layer 20. FIG. 8A illustrates the entire upper surface of the second portion 12, and FIG. 8B illustrates an enlarged partial portion of FIG. 8A. Both figures illustrate the delaminated surface of the modified layer 20 in the upper surface of the second portion 12. In FIG. 8B, it was observed that the processing marks 21 of the modified layer 20 were stuck together.

Figure 9:
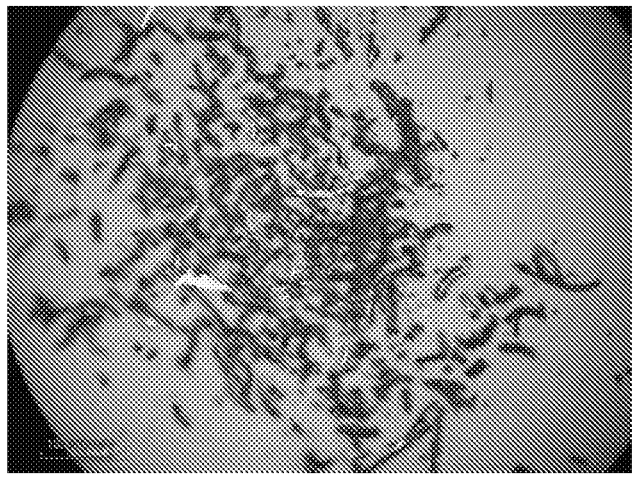
FIG. 9 is a micrograph of an adhesive tape pressure-bonded to and then peeled away from a delaminated surface of the block of single crystal diamond which has delaminated at the modified layer.

FIG. 9 is a micrograph of an adhesive tape pressure-bonded to and then peeled away from a delaminated surface of the block 10 of single crystal diamond which has delaminated at the modified layer 20. It was observed that graphite was transferred from the delaminated surface to the adhesive surface of the adhesive tape. Accordingly, it has become obvious that the graphite, which is derived from the processing marks 21 formed in the modified layer 20, exists on the delaminated surface in such a state that it can easily be peeled away by pressing and adhering adhesive tape thereto.

The present invention can be utilized for manufacturing a power device or a magnetic sensor using a diamond substrate.

What is claimed is:
1. A method of manufacturing a diamond substrate comprising:
    a step of placing a laser condensing unit configured to condense laser light so as to face an upper surface of a block of single crystal diamond as a main surface of said upper surface; and
    a step of forming a modified layer, which includes a processing mark of graphite, along the surface (111) of the single crystal diamond, at a predetermined depth from the upper surface of the block, and a crack extending in a [1-10 ] direction from the processing mark to a surrounding area around the processing mark along the surface (111), by radiating the laser light on the upper surface of the block from the laser condensing unit and condensing the laser light inside the block, and moving the laser condensing unit and the block in a relative manner two-dimensionally,
    wherein the step of forming the modified layer includes
        a step of moving the laser condensing unit and the block in a relative manner in a predetermined scanning direction; and a step of moving the laser condensing unit and the block in a relative manner in a direction orthogonal to the scanning direction at a line pitch d, and wherein the line pitch dis set such that a relationship between the line pitch d and a length L extending from the processing mark along the surface (111) of the crack satisfies the length L> the line pitch d.

2. The method of manufacturing a diamond substrate according to claim 1, wherein the block has a substantially planar shape having an upper surface as the (111) surface of the single crystal diamond.

3. The method of manufacturing a diamond substrate according to claim 2, wherein the step of forming the modified layer includes moving the laser condensing unit and the block-in a in the relative manner direction orthogonal to the scanning direction at a predetermined interval.

4. The method of manufacturing a diamond substrate according to claim 2, wherein the step of forming the modified layer includes forming the modified layer at a predetermined depth over an entire surface of the upper surface.

5. The method of manufacturing a diamond substrate according to claim 2, further comprising a step of causing the block to spontaneously delaminate into a portion up to a depth from the upper surface to the modified layer, and a portion deeper than the modified layer.

6. The method of manufacturing a diamond substrate according to claim 1, further comprising:

in the step of forming the modified layer the predetermined scanning direction is a [-1-12] direction or a [11-2] direction, and wherein the direction orthogonal to the scanning direction is a [−111] direction or a [1-10] direction.

7. The method of manufacturing a diamond substrate according to claim 6, wherein the laser light is pulsed laser light, and the graphite of the processing mark is formed by laser light reflected by a crack extending from another adjacent processing mark in at least one of the scanning direction and the direction orthogonal to the scanning direction.

8. The method of manufacturing a diamond substrate according to claim 1, wherein the step of forming the modified layer includes forming the modified layer at a predetermined depth over an entire surface of the upper surface.

9. The method of manufacturing a diamond substrate according to claim 1, further comprising a step of causing the block to spontaneously delaminate into a portion up to a depth from the upper surface to the modified layer, and a portion deeper than the modified layer.

10. The method of manufacturing a diamond substrate according to claim 1, wherein the laser light has a pulse width in a range of several ns to several hundred ns.

11. The method of manufacturing a diamond substrate according to claim 1, wherein in the step of forming the modified layer, the line pitch d is 50 μm to 100 μm.

12. The method of manufacturing a diamond substrate according to claim 1, wherein in the step of forming a modified layer, a processing mark directing toward a lower surface by a first scan line directing in a [-1-12] direction and a processing mark directing toward the upper surface by a second scan line directing in a [11-2] direction are formed by the laser light, and wherein a cleavage occurs in a [1-10] direction and the modified layer expands due to an expansion of the processing mark directing toward the upper surface.

13. A method of manufacturing a diamond substrate comprising:

a step of placing a laser condensing unit configured to condense laser light so as to face an upper surface of a block of single crystal diamond as a main surface of said upper surface; and a step of forming a modified layer, which includes a processing mark of graphite, along the surface (111) of the single crystal diamond, at a predetermined depth from the upper surface of the block, and a crack extending from the processing mark to a surrounding area around the processing mark and a crack extending in a [1-10] direction from the processing mark to a surrounding area around the processing mark along the surface (111), by radiating the laser light on the upper surface of the block from the laser condensing unit and condensing the laser light inside the block, and moving the laser condensing unit and the block in a relative manner two-dimensionally, wherein in the step of forming a modified layer, a processing mark directing toward a lower surface by a first scan line directing in a [-1-12] direction and a processing mark directing toward the upper surface by a second scan line directing in a [11-2] direction are formed by the laser light, and wherein a cleavage occurs in a [1-10] direction and the modified layer expands due to an expansion of the processing mark directing toward the upper surface.

14. The method of manufacturing a diamond substrate according to claim 13, wherein the block has a substantially planar shape having an upper surface as the (111) surface of the single crystal diamond.

15. The method of manufacturing a diamond substrate according to claim 13, wherein the step of forming the modified layer includes moving the laser condensing unit and the block in the relative manner in a direction orthogonal to the scanning direction at a predetermined interval.

16. The method of manufacturing a diamond substrate according to claim 15, wherein the step of forming the modified layer includes forming the modified layer at a predetermined depth over an entire surface of the upper surface.

17. The method of manufacturing a diamond substrate according to claim 15, further comprising a step of causing the block to spontaneously delaminate into a portion up to a depth from the upper surface to the modified layer, and a portion deeper than the modified layer.

18. The method of manufacturing a diamond substrate according to claim 13, wherein in the step of forming the modified layer, a scanning line of the laser light is scanned in a [-1-12] direction at a dot pitch, shifted by a line pitch in a [1-10] direction orthogonal to the [-1-12], and scanned in a [11-2] direction at a dot pitch.

19. The method of manufacturing a diamond substrate according to claim 13, wherein a growth height of the processing mark is 30 μm or less.

20. The method of manufacturing a diamond substrate according to claim 13, wherein the modified area is formed between a first portion and a second portion of the single crystal diamond.

* * * * *